(12) United States Patent
Xu

(10) Patent No.: US 9,263,483 B2
(45) Date of Patent: Feb. 16, 2016

(54) ARRAY PANEL AND MANUFACTURING METHOD FOR THE SAME

(71) Applicant: Shenzhen China Star Optoelectronics Technology Co., Ltd., Guangdong (CN)

(72) Inventor: Xiangyang Xu, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 28 days.

(21) Appl. No.: 14/379,734

(22) PCT Filed: May 9, 2014

(86) PCT No.: PCT/CN2014/077124
§ 371 (c)(1),
(2) Date: Aug. 19, 2014

(87) PCT Pub. No.: WO2015/168927
PCT Pub. Date: Nov. 12, 2015

(65) Prior Publication Data
US 2015/0372201 A1    Dec. 24, 2015

(30) Foreign Application Priority Data
May 4, 2014   (CN) .......................... 2014 1 0184922

(51) Int. Cl.
*H01L 33/00* (2010.01)
*H01L 21/00* (2006.01)
*H01L 27/146* (2006.01)

(52) U.S. Cl.
CPC .... *H01L 27/14603* (2013.01); *H01L 27/14621* (2013.01)

(58) Field of Classification Search
CPC ................... H01L 27/14603; H01L 27/14621
USPC .................................. 438/29–42; 257/98, 82
See application file for complete search history.

(56) References Cited

U.S. PATENT DOCUMENTS

| | | | | |
|---|---|---|---|---|
| 7,586,555 B2* | 9/2009 | Lee | ...................... | G02F 1/13394 349/106 |
| 7,738,059 B2* | 6/2010 | Kim | .................. | G02F 1/136209 349/106 |
| 7,750,999 B2* | 7/2010 | Park | ...................... | G02F 1/13394 349/110 |
| 8,107,038 B2* | 1/2012 | Kim | .................. | G02F 1/136209 345/88 |
| 8,648,988 B2* | 2/2014 | Kunimatsu | ........ | G02F 1/133723 349/125 |
| 8,854,879 B2* | 10/2014 | Shim | ...................... | G11C 16/10 365/185.03 |
| 2015/0123112 A1* | 5/2015 | Ro | ...................... | H01L 27/1248 257/43 |

* cited by examiner

*Primary Examiner* — Calvin Lee
(74) *Attorney, Agent, or Firm* — WPAT, P.C.; Anthony King

(57) ABSTRACT

An array panel including a substrate, a scanning line, a data line, and a pixel array is disclosed. A pixel unit in the pixel array includes a thin film transistor, a pixel electrode, and a color filter layer disposed between a first plane and a second plane. The first plane is a plane in which a gate electrode of the thin film transistor is located. The second plane is a plane in which the pixel electrode is located. The scanning line, the data line, and the pixel array are disposed on the substrate. The present invention is advantageous since it reduces power consumption.

17 Claims, 4 Drawing Sheets

ARRAY PANEL AND MANUFACTURING METHOD FOR THE SAME

BACKGROUND OF THE INVENTION

1. Field of the Invention

The present invention relates to a field of display technology, and more specifically to an array panel and a manufacturing method for the same.

2. Description of the Prior Art

In a traditional TFT-LCD (Thin Film Transistor Liquid Crystal Display), a color filter (CF) and a thin film transistor (TFT) array are disposed on different substrates, respectively. The thin film transistor array substrate includes a thin film transistor, a peripheral circuit, and a pixel electrode. The color filter substrate includes a common electrode, an R/G/B color filter, a position spacer (PS), and a black matrix (BM) layer. Since the color filter and the thin film transistor array are disposed on different glass substrates, respectively, the manufacturing time can be reduced.

In practice, at least one problem with the prior art, as given below, is found by the inventor.

The thin film transistor and the pixel electrode (or the extending portion thereof) in the thin film transistor array substrate have overlapping portions, and therefore the thin film transistor and the pixel electrode are able to form a capacitor. The capacitor influences the display of a pixel unit, and the reason is that the existence of the capacitor can lead to a voltage inputted in the pixel electrode to be failed to reach an expected value, thereby reducing the display quality.

However, in order to ensure the display quality, the voltage needs to be increased to exclude the effect of the capacitor, and more power will be needed to be consumed at this point.

Therefore, there is a need to provide a new technical scheme, so as to overcome the above-mentioned disadvantages.

SUMMARY OF THE INVENTION

An object of the present invention is to provide an array panel and a manufacturing method for the same. The present invention is capable of reducing the energy consumption of a pixel unit, thereby reducing the power consumption of the array panel.

To overcome the above-mentioned disadvantages, the technical schemes of the present invention are hereunder illustrated.

An array panel is provided. The array panel includes a substrate, at least one scanning line, at least one data line, and a pixel array. The pixel array includes at least one pixel unit. The at least one pixel unit includes a thin film transistor, a pixel electrode, and a color filter layer disposed between a first plane and a second plane. The first plane is a plane in which a gate electrode of the thin film transistor is located. The second plane is a plane in which the pixel electrode is located. The scanning line, the data line, and the pixel array are disposed on the substrate. The color filter layer is disposed on a first area and a second area. The first area and the second area respectively are areas on the substrate corresponding to the pixel electrode and the thin film transistor. There is at least one groove on the surface of the color filter layer. The shape of the groove corresponds to the shape of the pixel electrode. The pixel electrode is disposed in the groove.

In the array panel, the thin film transistor further includes a source electrode and a drain electrode, the color filter layer is covered on the source electrode and the drain electrode.

In the array panel, the color filter layer has a through hole. A connecting line is disposed in the through hole. The connecting line is connected between the pixel electrode and the drain electrode.

In the array panel, a transparent conductive material is deposited on the surface of the color filter and deposited in the groove of the color filter layer, and then the transparent conductive material on the surface is removed to obtain the pixel electrode.

In the array panel, concave portions or protruding portions are provided at the bottom surface or the side surface of the groove.

An array panel is provided. The array panel includes a substrate, at least one scanning line, at least one data line, and a pixel array. The pixel array includes at least one pixel unit. The at least one pixel unit includes a thin film transistor, a pixel electrode, and a color filter layer disposed between a first plane and a second plane. The first plane is a plane in which a gate electrode of the thin film transistor is located. The second plane is a plane in which the pixel electrode is located. The scanning line, the data line, and the pixel array are disposed on the substrate.

In the array panel, the color filter layer is disposed on a first area and a second area. The first area and the second area respectively are areas on the substrate corresponding to the pixel electrode and the thin film transistor.

In the array panel, the thin film transistor further includes a source electrode and a drain electrode. The color filter layer is covered on the source electrode and the drain electrode.

In the array panel, the color filter layer has a through hole. A connecting line is disposed in the through hole. The connecting line is connected between the pixel electrode and the drain electrode.

In the array panel, there is at least one groove on the surface of the color filter layer. The shape of the groove corresponds to the shape of the pixel electrode. The pixel electrode is disposed in the groove.

In the array panel, a transparent conductive material is deposited on the surface of the color filter layer and deposited in the groove of the color filter layer, and then the transparent conductive material on the surface is removed to obtain the pixel electrode.

In the array panel, concave portions or protruding portions are provided at the bottom surface or the side surface of the groove.

A method for manufacturing the array panel is provided. The method includes the following steps of: disposing the scanning line, the thin film transistor, and the data line onto the substrate, respectively; disposing the color filter layer onto a first area and a second area, wherein the first area is an area corresponding to a pixel electrode which is ready to be disposed, and the second area is an area corresponding to the thin film transistor; and disposing the pixel electrode onto the color filter layer.

In the method for manufacturing the array panel, before the step in which the pixel electrode is disposed on the color filter layer, the method further includes the following steps of: providing a through hole onto the color filter layer; and disposing a connecting line into the through hole, so that the connecting line connects with a drain electrode of the thin film transistor, and the connecting line extends to the surface of the color filter layer.

In the method for manufacturing the array panel, during the step in which the pixel electrode is disposed on the color filter layer, the method further includes the following step of:

disposing a conductive layer between the pixel electrode and the connecting line, so that the pixel electrode connects with the connecting line.

In the method for manufacturing the array panel, the connecting line is formed by coating or depositing a first conductive layer onto the through hole.

In the method for manufacturing the array panel, after forming the thin film transistor and before forming the color filter layer, the method further includes the following steps of: disposing a second conductive layer onto the drain electrode of the thin film transistor, wherein the thickness of the second conductive layer is greater than or equal to the thickness of the color filter layer which is ready to be disposed on the thin film transistor; photoetching the second conductive layer by a mask, so that a conductive column is formed on the drain electrode of the thin film transistor; and stripping portions other than the conductive column in the second conductive layer.

In the method for manufacturing the array panel, before the step in which the pixel electrode is disposed on the color filter layer, the method further includes the following step of: providing at least one groove onto the surface of the color filter layer, wherein the shape of the groove corresponds to the shape of the pixel electrode. The step in which the pixel electrode is disposed on the color filter layer includes the pixel electrode being disposed in the groove, so that the pixel electrode is held in the groove.

In the method for manufacturing the array panel, the step in which the pixel electrode is disposed in the groove includes a transparent conductive material being deposited on the surface of the color filter layer and deposited in the groove of the color filter layer, and then the transparent conductive material on the surface being removed to form the pixel electrode in the groove.

In the method for manufacturing the array panel, after the step in which at least one groove is provided on the surface of the color filter layer, the method further includes the following step of: photoetching or etching the bottom surface or the side surface of the groove, so that the bottom surface or the side surface of the groove has concave portions or protruding portions.

In comparison to the prior art, the array panel and the manufacturing method thereof of the present invention are capable of reducing the coupling capacitance formed by the gate electrode and the pixel electrode of the thin film transistor, thereby reducing the energy consumption of the pixel unit and also reducing the power consumption of the array panel.

The above objectives, and other objectives, features, advantages, and embodiments of the present invention will be better understood from the following description being considered in connection with the accompanied drawings and in which a preferred embodiment of the invention is illustrated by way of example.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced.

Figure 1:
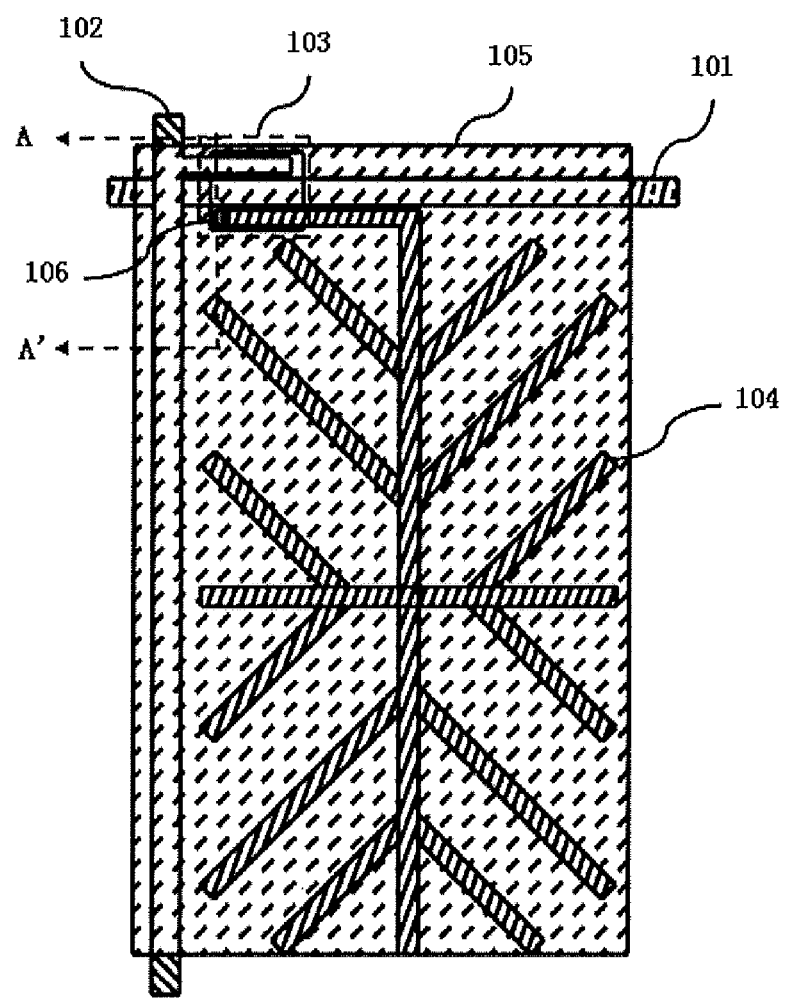
FIG. 1 is a schematic view of a pixel unit in an array panel according to the present invention.
Figure 2:
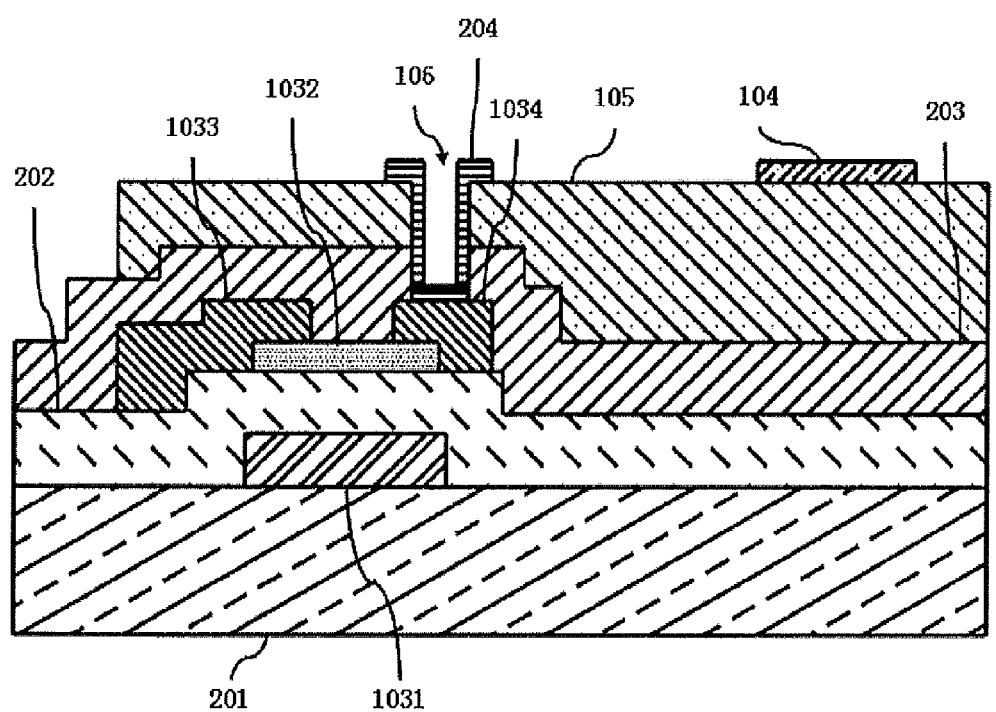
FIG. 2 is a schematic view of a first embodiment of a cross-section A-A' of FIG. 1.

Please refer to FIGS. 1 and 2. FIG. 1 is a schematic view of a pixel unit in an array panel according to the present invention. FIG. 2 is a schematic view of a first embodiment of a cross-section A-A' of FIG. 1.

The array panel of the embodiment includes a substrate 201, a pixel array, at least one scanning line 101, and at least one data line 102. The scanning line 101, the data line 102, and the pixel array are disposed on the substrate 20.

The pixel array includes at least one pixel unit. The at least one pixel unit includes a thin film transistor 103, a pixel electrode 104, and a color filter layer 105. The color filter layer 105 is disposed between a first plane and a second plane. The first plane is a plane in which a gate electrode 1031 of the thin film transistor 103 is located. The second plane is a plane in which the pixel electrode 104 is located.

In the array panel of the embodiment, the color filter layer 105 is disposed on a first area and a second area. The first area and the second area respectively are areas on the substrate 201 corresponding to the pixel electrode 104 and the thin film transistor 103.

In the array panel of the embodiment, the thin film transistor 103 further includes a source electrode 1033 and a drain electrode 1034. The color filter layer 105 is covered on the source electrode 1033 and the drain electrode 1034.

In the above technical scheme, a distance between the first plane in which the gate electrode 1031 is located and the second plane in which the pixel electrode 104 is located is increased by disposing the color filter layer 105 between the first plane in which the gate electrode 1031 of the thin film transistor 103 is located and the second plane in which the pixel electrode 104 is located, thereby reducing the coupling capacitance formed by the gate electrode 103 and the pixel electrode 104, thus reducing the energy consumption of the pixel unit and also reducing the power consumption of the array panel.

In the array panel of the embodiment, the color filter layer 105 has a through hole 106. A connecting line 204 is disposed in the through hole 106. The connecting line 204 is connected between the pixel electrode 104 and the drain electrode 1034.

The through hole 106 is formed by photoetching or etching the color filter layer 105. Moreover, the connecting line 204 is formed by coating or depositing a first conductive layer (e.g., a metal layer) onto the through hole 106. The connecting line 204 extends to the surface of the color filter layer 105. The surface of the color filter layer 105 is a surface of the color filter layer 105 opposite the substrate 201.

Moreover, the connecting line 204 can also be formed by the following method in the present embodiment. After forming the thin film transistor 103 and before forming the color filter layer 105, a second conductive layer (e.g., a metal layer) is disposed on the drain electrode 1034 of the thin film transistor 103. The thickness of the second conductive layer is greater than or equal to the thickness of the color filter layer 105 which is ready to be disposed on the thin film transistor 103 (the drain electrode 1034). Then, the second conductive layer is photoetched by a mask, so that a conductive column (corresponding to the connecting line 204) is formed on the drain electrode 1034 of the thin film transistor 103. Finally, portions other than the conductive column in the second conductive layer are stripped. The color filter layer 105 wraps around the side surface of the conductive column, and the top surface of the conductive column is connected with the pixel electrode 104.

Figure 3:
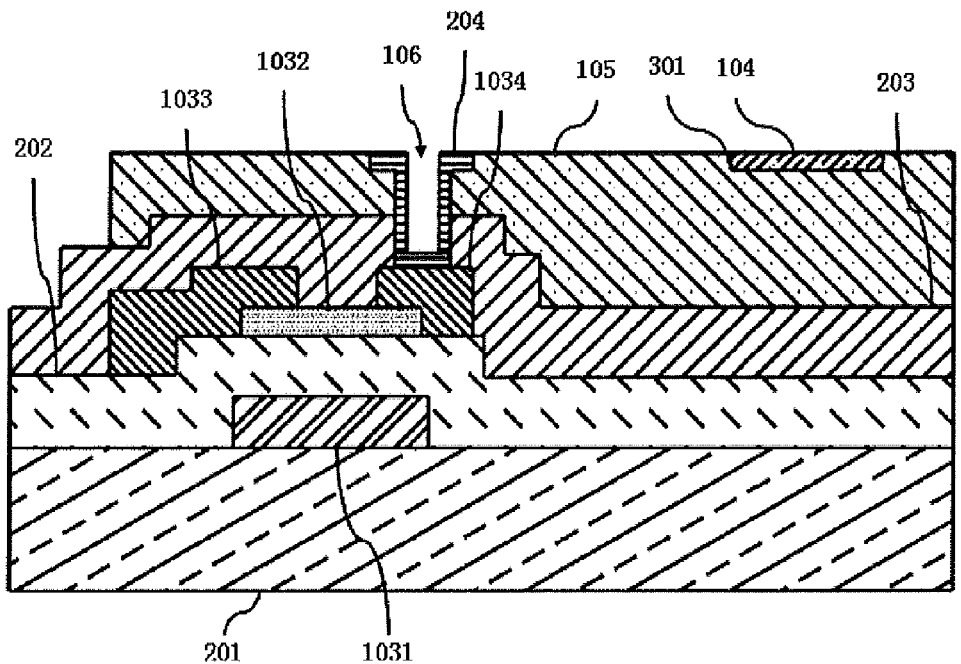
FIG. 3 is a schematic view of a second embodiment of a cross-section A-A' of FIG. 1.

Please refer to FIGS. 1 and 3. FIG. 3 is a schematic view of a second embodiment of a cross-section A-A' of FIG. 1. The present embodiment is similar to the first embodiment. The present embodiment and the first embodiment are different in that:

In the array panel of the embodiment, there is at least one groove 301 on the surface of the color filter layer 105. The shape of the groove 301 corresponds to the shape of the pixel electrode 104. The pixel electrode 104 is disposed in the groove 301. The color filter layer 105 is exposed and developed by a photolithography process to obtain the groove 301. A transparent conductive material is deposited on the surface of the color filter layer 105 and filled in the groove 301 of the color filter layer 105, and then the transparent conductive material on the surface is removed to obtain the pixel electrode 104.

The above technical scheme is advantageous since it firmly holds the pixel electrode 104 in the groove 301 of the color filter layer 105, and thereby the pixel electrode 104 is not easily disengaged from the surface of the color filter layer 105.

Moreover, as an improvement, the bottom surface or the side surface of the groove 301 can also be uneven. For example, concave portions or protruding portions are further provided at the bottom surface or the side surface of the groove 301. The concave portions or the protruding portions are obtained by photoetching or etching the groove 301.

The above technical scheme is advantageous since it increases the friction between the inner surface (i.e., the bottom surface and the side surface) of the groove 301 and the pixel electrode 104, so that the pixel is firmly held in the groove 301. Therefore, the pixel electrode 104 is not easily disengaged from the color filter layer 105.

Figure 4:
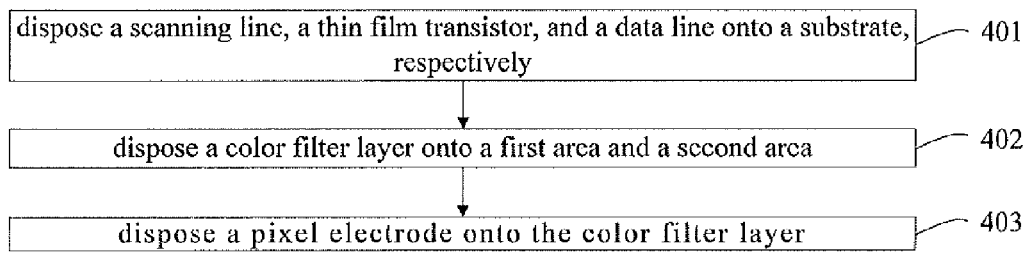
FIG. 4 is a flow chart of a method according to a first embodiment of the present invention for manufacturing the array panel.

FIG. 4 is a flow chart of a method according to a first embodiment of the present invention for manufacturing the array panel. The method for manufacturing the array panel of the embodiment includes the following steps (401-403).

In step 401, the scanning line 101, the thin film transistor 103, and the data line 102 are disposed on the substrate 201, respectively.

In step 402, the color filter layer 105 is disposed on the first area and the second area. The first area is an area corresponding to the pixel electrode 104 which is ready to be disposed. The second area is an area corresponding to the thin film transistor 103.

In step 403, the pixel electrode 104 is disposed on the color filter layer 105.

In the above technical scheme, the distance between the first plane in which the gate electrode 1031 is located and the second plane in which the pixel electrode 104 is located is increased by disposing the color filter layer 105 between the first plane in which the gate electrode 1031 of the thin film transistor 103 is located and the second plane in which the pixel electrode 104 is located, thereby reducing the coupling capacitance formed by the gate electrode 1031 and the pixel electrode 104, thus reducing the energy consumption of the pixel unit and also reducing the power consumption of the array panel.

Specifically, a gate electrode metal material (e.g., Cr, Mo, Al, or Cu, etc.) is first coated on the substrate 201 in accordance with an appropriate thickness (2000-5000 Å, in which, 1 Å is equal to $10^{-10}$ m). The gate electrode metal material is exposed and developed according to a special form based on a first photolithography process, and then the gate electrode metal material is wet-etched by a mask, and then the photoresist (PR) is stripped.

An insulation film 202 (2000-5000 Å) is formed by a plasma enhanced chemical vapor deposition (PECVD) after the gate electrode 1031 of the thin film transistor 103 is formed. After the insulation film 202 is formed, a semiconductor layer 1032 (i.e., an active layer (a-Si:H)) is formed by the PECVD in accordance with an appropriate film thickness (2000-4000 Å). The semiconductor layer 1032 is exposed and developed according to a special form based on a second photolithography process, and then the semiconductor layer 1032 is dry-etched by a mask, and then the PR is stripped.

After the semiconductor layer 1032 is formed, a film is coated on the insulation film 202 and the semiconductor layer 1032 in accordance with a certain thickness (1000-6000 Å) to form a source electrode/drain electrode metal material. The source electrode/drain electrode metal material is exposed and developed according to a special form based on a third photolithography process, and then the source electrode/drain electrode metal material is wet-etched and dry-etched (channel N+) by a mask, and then the PR is stripped, thereby forming the source electrode 1033/the drain electrode 1034 and the data line 102.

After the source electrode 1033 and the drain electrode 1034 are formed, an insulating protective film 203 (SiNx) is formed by the PECVD in accordance with an appropriate film thickness (1000-6000 Å). The insulating protective film 203 is exposed and developed according to a special form based on a fourth photolithography process, and then the insulating protective film 203 is dry-etched by a mask, and then the PR is stripped.

After the insulating protective film 203 is formed, a red (R) color film material layer is coated in accordance with an appropriate film thickness (7000-20000 Å). The red (R) color film material layer is exposed and developed according to a special form based on a fifth photolithography process to form a red color filter layer. Then, a green (G) color film material layer is coated in accordance with an appropriate film thickness (7000-20000 Å). The green (G) color film material layer is exposed and developed according to a special form based on a sixth photolithography process to form a green color filter layer. Then, a blue (B) color film material layer is coated in accordance with an appropriate film thickness (7000-20000 Å). The blue (B) color film material layer is exposed and developed according to a special form based on a seventh photolithography process to form a blue color filter layer. The sequence of forming the red color filter layer, the green color filter layer, and the blue color filter layer can be arbitrary.

After the color filter layers (i.e., the red color filter layer, the green color filter layer, and the blue color filter layer) are formed, a transparent electrode material (ITO or IZO) is coated in accordance with an appropriate thickness (100-1000 Å). The transparent electrode material is exposed and developed according to a special form based on an eighth photolithography process, and then the transparent electrode material is dry-etched by a mask, and then the PR is stripped.

Figure 5:
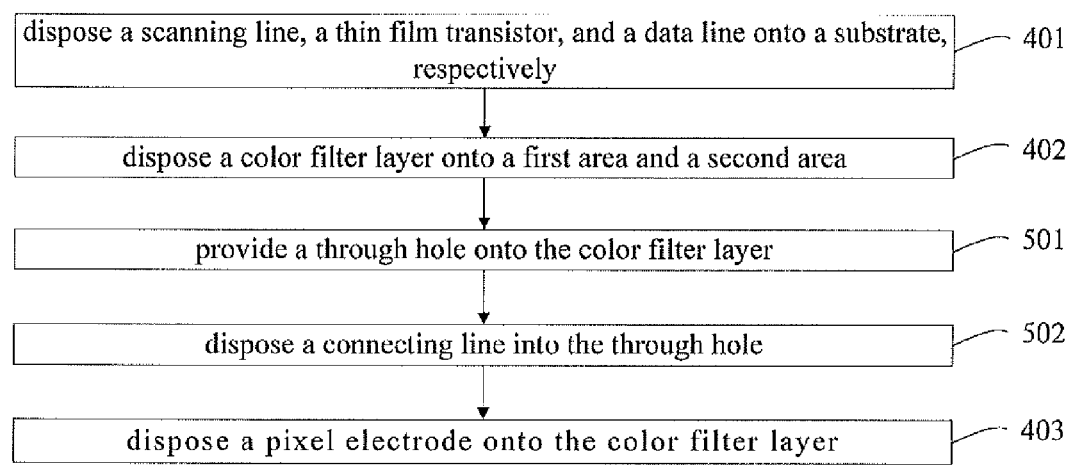
FIG. 5 is a flow chart of a method according to a second embodiment of the present invention for manufacturing the array panel.

FIG. 5 is a flow chart of a method according to a second embodiment of the present invention for manufacturing the array panel. The present embodiment is similar to the first embodiment. The present embodiment and the first embodiment are different in that:

In the method for manufacturing the array panel of the embodiment, before the step (i.e., step 403) in which the pixel electrode 104 is disposed on the color filter layer 105, the method further includes the following steps (501-502).

In step 501, the through hole 106 is provided on the color filter layer 105.

In step 502, a connecting line 204 is disposed in the through hole 106, so that the connecting line 204 is connected with the drain electrode 1034 of the thin film transistor 103, and the connecting line 204 extends to the surface of the color filter layer 105.

The surface of the color filter layer 105 is a surface of the color filter layer 105 opposite the substrate 201. The through hole 106 is formed by photoetching or etching the color filter layer 105. Moreover, the connecting line 204 is formed by coating or depositing the first conductive layer (e.g., the metal layer) onto the through hole 106.

Moreover, the connecting line 204 can also be formed by the following method in the present embodiment. After forming the thin film transistor 103 and before forming the color filter layer 105, the second conductive layer (e.g., the metal layer) is disposed on the drain electrode 1034 of the thin film transistor 103, the thickness of the second conductive layer is greater than or equal to the thickness of the color filter layer 105 which is ready to be disposed on the thin film transistor 103. Then, the second conductive layer is photoetched by the mask, so that a conductive column (corresponding to the connecting line 204) is formed on the drain electrode 1034 of the thin film transistor 103. Finally, portions other than the conductive column in the second conductive layer are stripped. The color filter layer 105 wraps around the side surface of the conductive column. The top surface of the conductive column is connected with the pixel electrode 104.

In the method for manufacturing the array panel of the embodiment, during the step in which the pixel electrode 104 is disposed on the color filter layer 105, the method further includes the following step of:
disposing the conductive layer between the pixel electrode 104 and the connecting line 204, so that the pixel electrode 104 connects with the connecting line 204. The step of disposing the conductive layer and the step of disposing the pixel electrode 104 (i.e., step 403) are performed simultaneously.

A third embodiment of a method according the present invention for manufacturing the array panel is similar to the first embodiment or the second embodiment. The third embodiment and the first embodiment (or the second embodiment) are different in that:

Before the step in which the pixel electrode 104 is disposed on the color filter layer 105, the method further includes the following step of: providing at least one groove 301 onto the surface of the color filter layer 105. The shape of the groove 301 corresponds to the shape of the pixel electrode 104. The step of disposing the groove 301 and the step of disposing the through hole 106 (i.e., step 501) are performed simultaneously.

The step in which the pixel electrode 104 is disposed on the color filter layer 105 includes the pixel electrode 104 being disposed in the groove 301, so that the pixel electrode 104 is held in the groove 301.

The color filter layer 105 is exposed and developed by a photolithography process to obtain the groove 301. The transparent conductive material is deposited on the surface of the color filter layer 105 and filled in the groove 301 of the color filter layer 105, and then the transparent conductive material on the surface is removed to obtain the pixel electrode 104.

The above technical scheme is advantageous since it firmly holds the pixel electrode 104 in the groove 301 of the color filter layer 105, and thereby the pixel electrode 104 is not easily disengaged from the surface of the color filter layer 105.

A fourth embodiment of a method according the present invention for manufacturing the array panel is similar to the third embodiment. The fourth embodiment and the third embodiment are different in that:

After the groove 301 is formed on the surface of the color filter layer 105, the bottom surface or the side surface of the groove 301 is photoetched or etched, so that the bottom surface or the side surface of the groove 301 is uneven. For example, concave portions or protruding portions are provided at the bottom surface or the side surface of the groove 301, that is, the concave portions or the protruding portions are obtained by photoetching or etching the groove 301.

The above technical scheme is advantageous since it increases the friction between the inner surface (i.e., the bottom surface and the side surface) of the groove 301 and the pixel electrode 104, so that the pixel is firmly held in the groove 301. Therefore, the pixel electrode 104 is not easily disengaged from the color filter layer 105.

It should be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:
1. An array panel, comprising:
a substrate;
at least one scanning line;
at least one data line; and
a pixel array comprising at least one pixel unit, the at least one pixel unit comprising:
a thin film transistor;
a pixel electrode; and
a color filter layer disposed between a first plane and a second plane,
wherein the first plane is a plane in which a gate electrode of the thin film transistor is located,
and the second plane is a plane in which the pixel electrode is located,
wherein the scanning line, the data line, and the pixel array are disposed on the substrate, the color filter layer is disposed on a first area and a second area, the first area and the second area respectively are areas on the substrate corresponding to the pixel electrode and the thin film transistor, there is at least one groove on a surface of the color filter layer, a shape of the groove corresponds to a shape of the pixel electrode, and the pixel electrode is disposed in the groove; and
wherein a transparent conductive material is deposited on the surface of the color filter layer and deposited in the groove of the color filter layer, and then the transparent conductive material on the surface is removed to obtain the pixel electrode.
2. The array panel of claim 1, wherein concave portions or protruding portions are provided at a bottom surface or a side surface of the groove.

3. The array panel of claim 1, wherein the thin film transistor further comprises a source electrode and a drain electrode, and the color filter layer is covered on the source electrode and the drain electrode.

4. The array panel of claim 3, wherein the color filter layer has a through hole, a connecting line is disposed in the through hole, and the connecting line is connected between the pixel electrode and the drain electrode.

5. An array panel, comprising:
   a substrate;
   at least one scanning line;
   at least one data line; and
   a pixel array comprising at least one pixel unit, the at least one pixel unit comprising:
      a thin film transistor;
      a pixel electrode; and
      a color filter layer disposed between a first plane and a second plane, wherein the first plane is a plane in which a gate electrode of the thin film transistor is located, and the second plane is a plane in which the pixel electrode is located,
   wherein the scanning line, the data line, and the pixel array are disposed on the substrate;
   wherein there is at least one groove on a surface of the color filter layer, a shape of the groove corresponds to a shape of the pixel electrode, and the pixel electrode is disposed in the groove; and
   wherein a transparent conductive material is deposited on the surface of the color filter layer and deposited in the groove of the color filter layer, and then the transparent conductive material on the surface is removed to obtain the pixel electrode.

6. The array panel of claim 5, wherein concave portions or protruding portions are provided at a bottom surface or a side surface of the groove.

7. The array panel of claim 5, wherein the color filter layer is disposed on a first area and a second area, and the first area and the second area respectively are areas on the substrate corresponding to the pixel electrode and the thin film transistor.

8. The array panel of claim 7, wherein the thin film transistor further comprises a source electrode and a drain electrode, and the color filter layer is covered on the source electrode and the drain electrode.

9. The array panel of claim 8, wherein the color filter layer has a through hole, a connecting line is disposed in the through hole, and the connecting line is connected between the pixel electrode and the drain electrode.

10. A method for manufacturing the array panel as claimed in claim 5, comprising the following steps of:
    disposing the scanning line, the thin film transistor, and the data line onto the substrate, respectively;
    disposing the color filter layer onto a first area and a second area, wherein the first area is an area corresponding to the pixel electrode which is ready to be disposed, and the second area is an area corresponding to the thin film transistor; and
    disposing the pixel electrode onto the color filter layer.

11. The method for manufacturing the array panel of claim 10, wherein before the step in which the pixel electrode is disposed on the color filter layer, the method further comprises the following step of:
    providing at least one groove onto a surface of the color filter layer, wherein a shape of the groove corresponds to a shape of the pixel electrode; and
    the step in which the pixel electrode is disposed on the color filter layer comprises the pixel electrode being disposed in the groove, so that the pixel electrode is held in the groove.

12. The method for manufacturing the array panel of claim 11, wherein the step in which the pixel electrode is disposed in the groove comprises a transparent conductive material being deposited on the surface of the color filter layer and being deposited in the groove of the color filter layer, and then the transparent conductive material on the surface being removed to form the pixel electrode in the groove.

13. The method for manufacturing the array panel of claim 11, wherein after the step in which at least one groove is provided on the surface of the color filter layer, the method further comprises the following step of:
    photoetching or etching a bottom surface or a side surface of the groove, so that the bottom surface or the side surface of the groove has concave portions or protruding portions.

14. The method for manufacturing the array panel of claim 10, wherein before the step in which the pixel electrode is disposed on the color filter layer, the method further comprises the following steps of:
    providing a through hole onto the color filter layer; and
    disposing a connecting line into the through hole, so that the connecting line connects with the drain electrode of the thin film transistor, and the connecting line extends to a surface of the color filter layer.

15. The method for manufacturing the array panel of claim 14, wherein during the step in which the pixel electrode is disposed on the color filter layer, the method further comprises the following step of:
    disposing a conductive layer between the pixel electrode and the connecting line, so that the pixel electrode connects with the connecting line.

16. The method for manufacturing the array panel of claim 14, wherein the connecting line is formed by coating or depositing a first conductive layer onto the through hole.

17. The method for manufacturing the array panel of claim 14, wherein after the thin film transistor and before forming the color filter layer are formed, the method further comprises the following steps of:
    disposing a second conductive layer onto the drain electrode of the thin film transistor, wherein a thickness of the second conductive layer is greater than or equal to a thickness of the color filter layer which is ready to be disposed on the thin film transistor;
    photoetching the second conductive layer by a mask, so that a conductive column is formed on the drain electrode of the thin film transistor; and
    stripping portions other than the conductive column in the second conductive layer.

\* \* \* \* \*